(12) United States Patent
Ha

(10) Patent No.: US 6,268,249 B1
(45) Date of Patent: Jul. 31, 2001

(54) SEMICONDUCTOR DEVICE AND METHOD OF FABRICATING THE SAME

(75) Inventor: Jong-Bong Ha, Kyongsangnam-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/369,297

(22) Filed: Aug. 6, 1999

(30) Foreign Application Priority Data

Sep. 14, 1998 (KR) .................................................. 98-37796

(51) Int. Cl.[7] .................................................. H01L 21/336
(52) U.S. Cl. .................................................. 438/270; 438/589
(58) Field of Search .................................................. 438/270, 268, 438/272, 589, 138, 271, 273

(56) References Cited

U.S. PATENT DOCUMENTS

| | | | |
|---|---|---|---|
| 5,250,450 | * 10/1993 | Lee et al. .......................... | 438/589 |
| 5,481,126 | 1/1996 | Subramanian et al. .............. | 257/273 |
| 5,610,419 | 3/1997 | Tanaka .................................. | 257/315 |
| 5,672,524 | * 9/1997 | Liu et al. .............................. | 438/270 |
| 5,895,253 | * 4/1999 | Akram ................................. | 438/424 |
| 5,940,707 | * 8/1999 | Gardner et al. ..................... | 438/270 |

* cited by examiner

*Primary Examiner*—Michael Trinh
(74) *Attorney, Agent, or Firm*—Morgan, Lewis & Bockius LLP

(57) ABSTRACT

The present invention relates to a semiconductor device and a method of fabricating the same. A semiconductor device having first and second transistor regions and a field region includes a semiconductor substrate having a first type conductivity, a first trench in the substrate at the field region separating the first and second transistor regions from each other, a second trench in the substrate over the first trench, a first field oxide layer in the first trench, a second field oxide layer in the second trench over the first field oxide layer, first and second gate oxide layers on sides of the second trench, first and second gates in the second field oxide layer, and second and third impurity regions at the bottom surface of the second trench and first and fourth impurity regions outside the second trench on the substrate.

8 Claims, 6 Drawing Sheets

SEMICONDUCTOR DEVICE AND METHOD OF FABRICATING THE SAME

This application claims the benefit of Korean Application No. 98-37796 filed on Sep. 14, 1998, which is hereby incorporated by reference.

BACKGROUND OF THE INVENTION

1. Field of the Invention

The present invention relates to a semiconductor device, and more particularly, to a semiconductor device and a method of fabricating the same. Although the present invention is suitable for a wide scope of applications, it is particularly suitable for improving degree of integration and preventing short channel effect in the semiconductor device.

2. Discussion of the Related Art

A recent multimedia system is capable of displaying videos, voices and characters at the same time. Thus, it becomes important to have various, complicated, and improved functions as well as smaller size and lighter weight. To meet such demands, technologies for forming semiconductor circuits on one-chip having various functions have been developed.

A plurality of semiconductor circuits formed on one-chip have various functions and are operated by different power supplies. Each of the circuits should be constructed to be able to perform its own function when they are formed on the same semiconductor substrate. Accordingly, it is required that transistors having various operating voltages should be formed on the same semiconductor substrate. This can be achieved by forming various thicknesses of gate oxides to properly control threshold voltages.

FIG. 1 shows a cross-sectional view of a semiconductor device according to a related background art. As shown in FIG. 1, a field oxide layer 19 defining first and second transistor regions T11 and T12 in a field area F11 is formed on a p-type semiconductor substrate 11. The field oxide layer 19 is formed by a shallow trench isolation (STI) method. For example, a trench 17 having a predetermined depth in the semiconductor substrate 11 is filled with silicon oxide. Alternatively, the field oxide layer 19 may be formed by local oxidation of silicon (LOCOS).

First and second gates 25 and 26 on first and second gate oxide layers 21 and 23 are formed at predetermined portions of the first and second transistor regions T11 and T12, respectively. The first gate oxide layer 21 is formed at the first transistor region T11 by two separate thermal oxidations while the second gate oxide layer 23 is formed at the second transistor region T12 by a single thermal oxidation. Thus, the first gate oxide 21 becomes thicker than the second gate oxide 23.

First and second diffusion regions 28 and 29 for a source and drain are formed in the first and the second transistor regions T11 and T12 of the semiconductor substrate 11. The first and second diffusion regions 28 and 29 are formed by heavily doping with n-type impurities using the first and the second gates 25 and 26 as ion-implantation masks.

FIGS. 2A to 2E are cross-sectional views illustrating the process steps of fabricating a semiconductor device according to the related background art.

Initially referring to FIG. 2A, a buffer oxide layer 13 is formed on a semiconductor substrate 11 by thermal oxidation. A hard mask layer 15 is then formed on the buffer oxide layer 13 by depositing silicon nitride thereon by chemical vapor deposition (CVD).

Thereafter, first and second transistor regions T11 and T12 are defined by patterning the hard mask layer 15 and the buffer oxide layer 13 through photolithography, so that a portion of the semiconductor substrate 11 is exposed as a field area F11.

Referring to FIG. 2B, a field oxide layer 19 electrically isolating the first transistor region T11 from the second transistor region T12 is formed at the field area F11.

In this process, a trench 17 having a predetermined depth is formed at the field area F11 using the hard mask layer 15 (shown in FIG. 2A) on the first and second transistor regions T11 and T12 of the semiconductor substrate 11. The trench 17 is then filled with silicon oxide by depositing silicon oxide including the hard mask layer 15 by CVD. A field oxide layer 19 is formed by chemical-mechanical polishing (CMP) to expose the hard mask layer 15 and to have the silicon oxide remain only in the trench 17. The field oxide layer 19 may be formed by either LOCOS or STI.

Then, the hard mask layer 15 and the buffer oxide layer 13 (shown in FIG. 2A) on the first and second transistor regions T11 and T12 are removed from the semiconductor substrate 11.

In FIG. 2C, a first gate oxide layer 21 is formed on the first and second transistor regions T11 and T12 of the semiconductor substrate 11 by thermal oxidation. The first gate oxide layer 21 on the second transistor region T12 is then removed by photolithography. Thus, only the first gate oxide layer 21 at the first transistor region T11 remains on the semiconductor substrate 11.

FIG. 2D shows a second gate oxide layer 23 formed on the exposed surface of the second transistor region T12 of the semiconductor substrate 11 by thermal oxidation. In this process, the first gate oxide layer 23 at the first transistor region T11 becomes thicker. As a result, the first gate oxide layer 21 is thicker than the second gate oxide layer 23.

Referring to FIG. 2E, polycrystalline silicon doped with impurities is deposited on the first and second gate oxide layers 21 and 23 and the field oxide layer 19 by CVD. Then, first and second gates 25 and 26 are formed by patterning the polycrystalline silicon. The first and second gate oxide layers 21 and 23, thus, remain at predetermined portions of the first and second transistor regions T11 and T12 of the semiconductor substrate 11.

First and second diffusion regions 28 and 29 for a source and drain of first and second transistors are formed by heavy ion-implantation with n-type impurities using the first and second gates 25 and 26 as masks.

As explained in the foregoing description, the semiconductor device according to the related background art is fabricated by forming a first gate oxide layer only on a first transistor region of a semiconductor substrate and by forming a second gate oxide layer on the exposed surface of a second transistor region of the semiconductor substrate by thermal oxidation. In this process, the first gate oxide layer on the first transistor region becomes thicker than the second gate oxide layer. Hence, transistors having a plurality of gate oxide layers which have different thicknesses are fabricated by the previously described background art method.

However, the above-mentioned method has the following drawbacks. For example, a desirable thickness of the gate oxide layers cannot be readily achieved because the gate oxide layers should be etched and re-oxidized. Moreover, since the gates are formed on the semiconductor substrate, the planarization of multi-layered wires becomes worse, and a short channel effect occurs due to reduction in size of the device.

SUMMARY OF THE INVENTION

Accordingly, the present invention is directed to a semiconductor device and a method fabricating method the same that substantially obviate one or more of the problems due to limitations and disadvantages of the related art.

Another object of the present invention is to provide a semiconductor device of which degree of integration is improved and in which gate oxide layers are easily controlled in thickness.

Another object in the present invention is to provide a semiconductor device in which planarization in multi-layered wires is improved and in which a short channel effect is prevented.

A further object of the present invention is to provide a method of fabricating a semiconductor device wherein a plurality of gate oxide layers are easily formed and the thickness of the gate oxide layers are easily controlled.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device having first and second transistor regions and a field region includes a semiconductor substrate having a first type conductivity, a first trench in the substrate at the field region separating the first and second transistor regions from each other, a second trench in the substrate over the first trench, a first field oxide layer in the first trench, a second field oxide layer in the second trench over the first field oxide layer, first and second gate oxide layers on sides of the second trench, first and second gates in the second field oxide layer, and second and third impurity regions at the bottom surface of the second trench and first and fourth impurity regions outside the second trench on the substrate.

In another aspect of the present invention, a semiconductor device having first and second transistor regions and a field region includes a semiconductor substrate having a first type conductivity, a first trench in the substrate at the field region separating the first and second transistor regions from each other, a second trench in the substrate over the first trench, a first field oxide layer in the first trench, a second field oxide layer in the second trench over the first field oxide layer, third and fourth trenches at the first and second transistor regions of the second field oxide layer, first and second gate oxide layers between the second and third trenches and the second and fourth trenches, wherein the first and second gate oxide layers have thickness different from each other, first and second gates in the third and fourth trenches at the first and second transistor regions, respectively, first and second impurity regions of a second type conductivity outside the second trench on the substrate and on the bottom surface of the second trench, and third and fourth impurity regions of a second conductive type on the bottom surface of the second trench and outside the second trench.

In another aspect of the present invention, a semiconductor device having first and second transistor regions and a field region includes a semiconductor substrate having a first type conductivity, a first trench in the substrate at the field region separating the first and second transistor regions from each other, a first field oxide layer in the first trench, a well region having a second type conductivity at the first transistor region, a second trench over the first trench in the substrate, the second trench having a width greater than the first trench, a second field oxide layer in the second trench over the first field oxide layer, third and fourth trenches in the second field oxide layer, first and second gate oxide layers between sides of the second trench and the third and fourth trenches, wherein the first and second gate oxide layers have thicknesses different from each other, first and second gates in the third and fourth trenches, respectively, first and second impurity regions of a second type conductivity outside the second trench on the substrate and on the bottom surface of the second trench, and third and fourth impurity regions of a second type conductivity on the bottom surface of the second trench and outside the second trench.

In a further aspect of the present invention, a method of fabricating a semiconductor device having first and second transistor regions and a field region includes the steps of forming a first trench in the field area of a semiconductor substrate, thereby defining the first and second transistor regions, forming a second trench over the first trench in the semiconductor substrate, forming a first field oxide layer in the first trench, forming first, second, third and fourth impurity regions outside the second trench and on the bottom surface of the second trench except where the first field oxide layer is formed, forming a second field oxide layer in the second trench over the second and third impurity regions including the first field oxide layer, forming third and fourth trenches in the second field oxide layer, so as to define first and second gate oxide layers, and forming first and second gates in the third and fourth trenches.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principles of the invention.

In the drawings.

DETAILED DESCRIPTION OF THE PREFERRED EMBODIMENTS

Reference will now be made in detail to the preferred embodiment of the present invention, examples of which are illustrated in the accompanying drawings.

Figure 1:
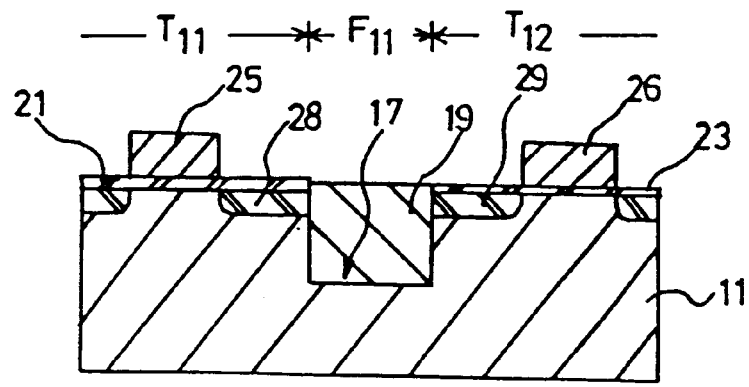
FIG. 1 is a cross-sectional view of a semiconductor device according to a related background art.
Figure 2A:
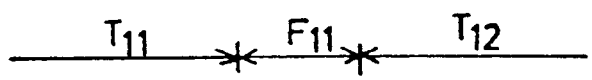
FIG. 2A to FIG. 2E are cross-sectional views illustrating the process steps of fabricating a semiconductor device according to the related background art.
Figure 2A:
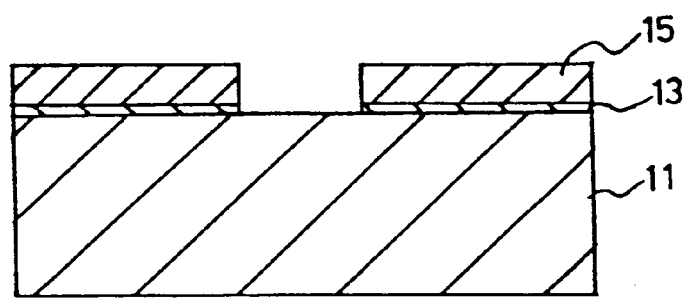
Figure 2B:
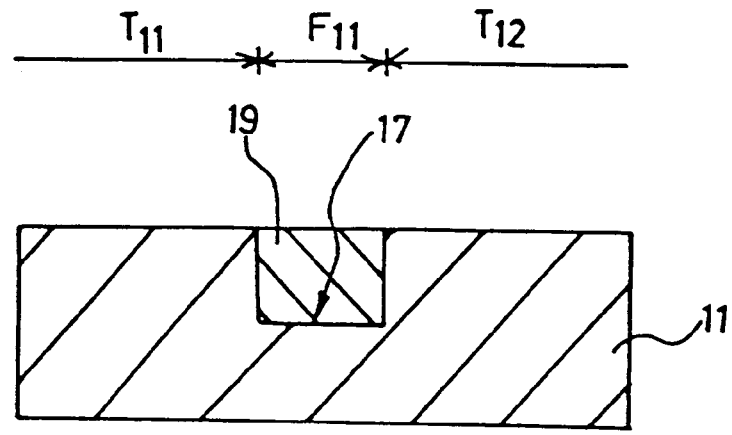
Figure 2C:
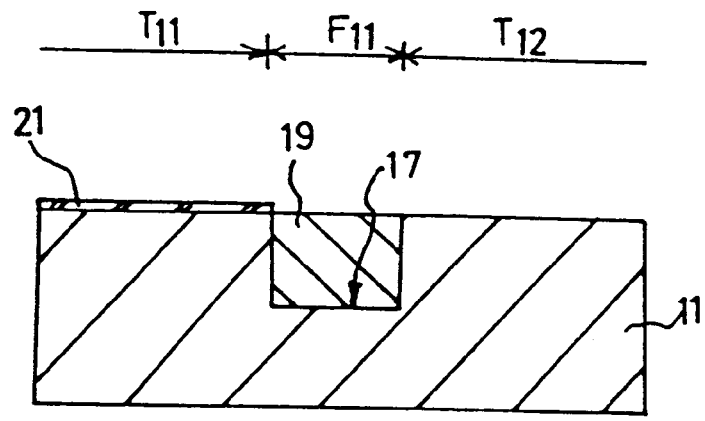
Figure 2D:
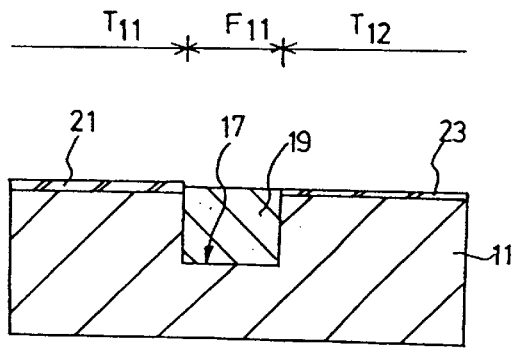
Figure 2E:
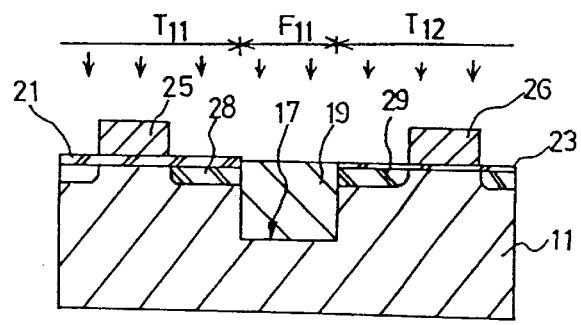
Figure 3:
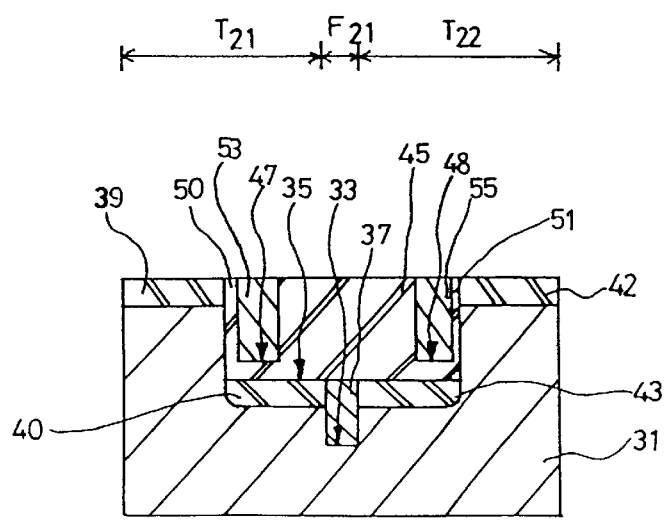
FIG. 3 is a cross-sectional view of the semiconductor device according to a first embodiment of the present invention.

FIG. 3 shows a cross-sectional view of a semiconductor device according to a first embodiment of the present invention.

As shown in FIG. 3, a first trench 33 separating first and second transistor regions T21 and T22 from each other is formed at a field area F21 of a p-type semiconductor substrate 31. The first trench 33 has a depth of 1000 to 2000 Å. A second trench 35 is then formed to have a depth of 1500 to 8000 Å over the first trench 33. Thus, the second trench 35 is formed at portions of the first and second transistor regions T21 and T22 including the field area 21.

A first field oxide layer 37 is formed in the first trench 33. The first field oxide layer 37 is formed by depositing silicon oxide in the first trench 33 with CVD and by etching back the silicon oxide using reactive ion etching (RIE).

A second field oxide layer 45 is formed in the second trench 35. Third and fourth trenches 47 and 48 having a width of 1000 to 2000 Å are formed at the first and second transistor regions T21 and T22 of the second field oxide layer 45. The second field oxide layer 45 is formed by depositing silicon oxide with CVD to fill up the second trench 35 and by etching back the silicon oxide with CMP or RIE. The third and fourth trenches 47 and 48 are formed by photolithography with anisotropic etching.

First and second gates 53 and 55 of polycrystalline silicon doped with impurities are formed in the third and fourth trenches 47 and 48. The first and second gates 53 and 55 are formed by depositing polycrystalline silicon doped with impurities to fill up the third and fourth trenches 47 and 48 with CVD and by etching back the polycrystalline silicon with CMP or RIE. This embodiment provides a better planarization for multi-layered wires since the first and second gates 53 and 55 are buried in the third and fourth trenches 47 and 48.

The second field oxide layer 45 remaining at the sides of the second trench 35 and between the first and the second gate 53 and 55 becomes first and second gate oxide layers 50 and 51, respectively. Thus, thicknesses of the first and second gate oxide layers 50 and 51 are determined when the third and fourth trenches 47 and 48 are formed in the second field oxide layer 45. Preferably, the thicknesses of the first and second gate oxide layers 50 and 51 are in the ranges of 40–70 Å and 100–150 Å, respectively. The thicknesses of the first and second gate oxide layers 50 and 51 can be controlled precisely since they are defined in the process of forming the third and fourth trenches 47 and 48.

First and second impurity regions 39 and 40 for a first source/drain of a first transistor and third and fourth impurity regions 42 and 43 for a second source/drain region of a second transistor are respectively formed at the bottom portion of the second trench 35 and outside the second trench 35 by doping with n-type impurities. The side portions of the second field oxide layer 45 in the second trench 35 between the first and second impurity regions 39 and 40 and between the third and fourth impurity regions 42 and 43 become channel regions of the first and second transistor, respectively. By this embodiment, the degree of integration of device is improved since the second impurity region 40 and the third impurity region 43 at the bottom of the second trench 35 are overlapped with the second field oxide layer 45 and the channel regions are vertically formed.

As mentioned in the above description, the thicknesses of the first and second gate oxide layers 50 and 51 of the semiconductor devices according to the first embodiment of the present invention are controlled precisely because the thicknesses are defined in the process of forming the third and fourth trenches 47 and 48. The present invention also provides a better planarization since the first and second gates 53 and 55 are buried in the third and fourth trenches 47 and 48, respectively. The present invention further provides a higher degree of integration because the second and third impurity regions 40 and 43 at the bottom of the second trench 35 are overlapped with the second field oxide layer 45 and the channel regions are vertically formed in the second trench 35.

In the above explanation, the semiconductor devices according to the first embodiment of the present invention include first and second transistors having an n-type conductivity at the first and second transistor regions of a p-type semiconductor substrate. Alternatively, the present invention may be presented such that first and second transistors having a p-type conductivity are formed at first and second transistor regions of an n-type semiconductor substrate. Further, the present invention may be realized by forming a first transistor of an n-type and a second transistor of a p-type in a p-type semiconductor substrate and forming an n-type well at a first or second transistor region.

Figure 4:
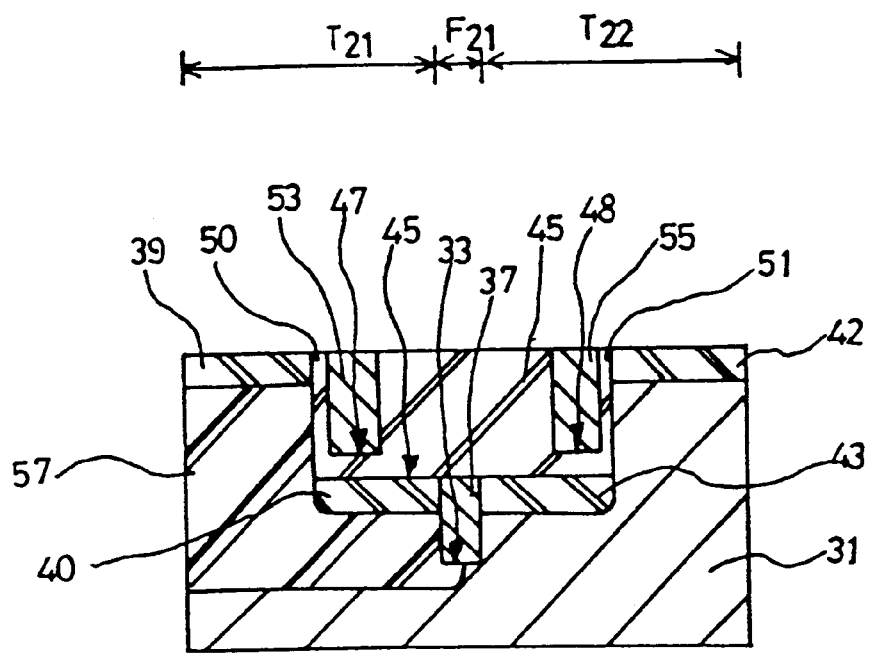
FIG. 4 is a cross-sectional view of the semiconductor device according to a second embodiment of the present invention.

FIG. 4 is a cross-sectional view of a semiconductor device according to a second embodiment of the present invention.

The second embodiment of the present invention is similar to the first embodiment shown in FIG. 3 except that a first transistor of a p-type is formed at the first transistor region T21 of the p-type semiconductor substrate 31 and a second transistor of an n-type is in the second transistor region T22, thereby forming a complementary MOS (CMOS). Accordingly, for convenience, the elements shown in FIG. 3 are designated by the same reference numbers used in FIG. 3.

As shown in FIG. 4, an n-type well region 57 is formed in the first transistor region T21 of the p-type semiconductor substrate 31. Thus, a first and second transistor of a p-type is formed by heavily doping the first and second impurity regions 39 and 40 for a source/drain with p-type impurities in the first transistor region T21. Alternatively, a first transistor of an n-type may be formed by heavily doping third and fourth impurity regions 42 and 43 for a source/drain with n-type impurities in the second transistor region T22.

In the above description of the second embodiment of the present invention, the n-type well region is formed at the first transistor region of the p-type semiconductor substrate. Instead, the n-type well region may be formed in the second transistor region, or both an n-type well and a p-type well may be formed at first and second transistor regions of an n-type or a p-type semiconductor substrate.

FIGS. 5A to 5E are cross-sectional views illustrating the process steps of fabricating the semiconductor device of FIG. 3.

Figure 5A:
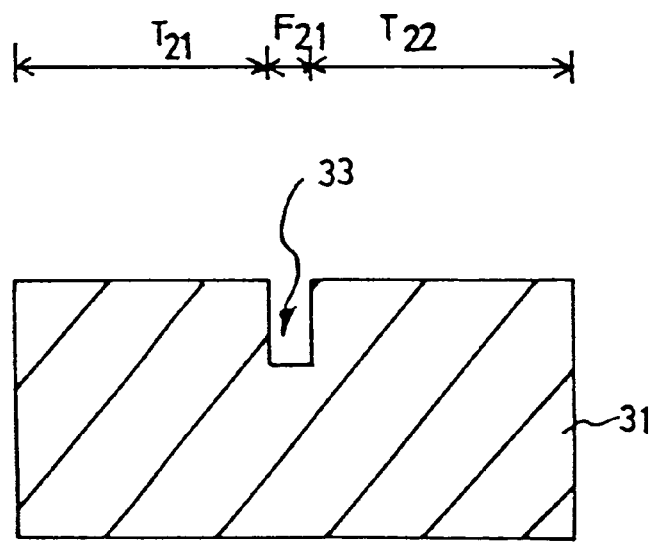
FIGS. 5A to 5E are cross-sectional views illustrating the process steps of fabricating the semiconductor device of FIG. 3.

Initially referring to FIG. 5A, first and second transistor regions T21 and T22 are defined in a field area F21 of a p-type semiconductor substrate 31 for devices by forming a first trench 33 having a depth of 1000 to 2000 Å by anisotropic etching such as RIE and the like.

Figure 5B:
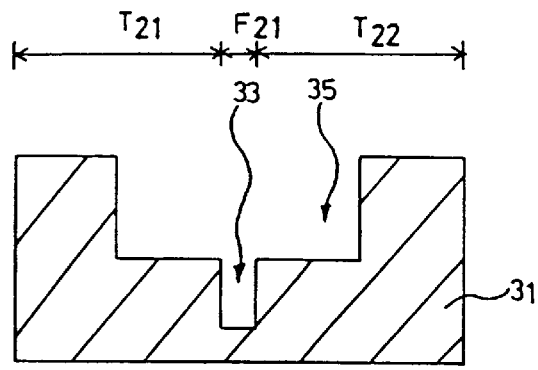

Referring to FIG. 5B, a second trench 35 having a depth between 1500 and 8000 Å is formed by the same method of forming the first trench 33 within the field area F21 of the semiconductor substrate 31 and the first and second transistor regions T21 and T22. In this process, the bottom surface of the first trench 33 has a depth step different from that of the second trench 35.

In the above description, the second trench 35 is formed after the first trench 33 has been formed. Instead, the first trench 33 may be formed in the second trench 35. In either case, the second trench 35 has a width greater than the first trench 33.

Figure 5C:
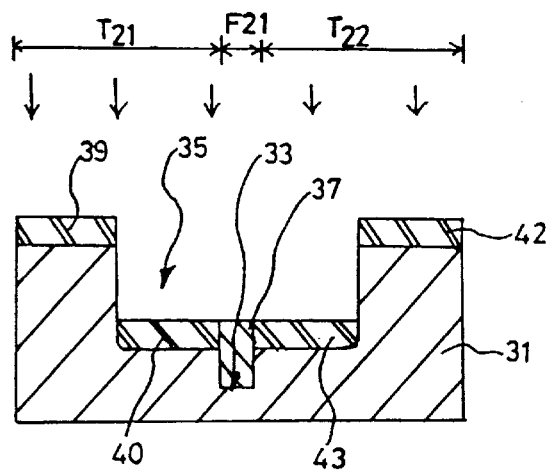

Referring to FIG. 5C, a first field oxide layer of silicon oxide 37 is formed in the first trench 33. The first field oxide layer 37 is formed on the semiconductor substrate 31 by depositing silicon oxide to fill up the first trench 33 with CVD. Only the silicon oxide inside the first trench remains after an etching back process by RIE.

First and second impurity regions 39 and 40 for a source/drain region of a first transistor and third and fourth impurity regions 42 and 43 for a source/drain of a second transistor are formed at the portions where the second trench 35 is not formed in the semiconductor substrate 31 and at the bottom surface of the second trench 35.

In this process, the first and second impurity regions 39 and 40 and the third and fourth impurity regions 42 and 43 are formed without using a mask by ion implantation as well as diffusion. N-type impurities such as P or As are used in this process with a dosage between $1 \times 10^{15}$ and $5 \times 10^{15}$ ions/cm$^2$. Thus, degree of integration is improved because the sides between the first and second impurity regions 39 and 40 and between the third and fourth impurity regions 42 and 43 become channel regions of the first and second transistors, respectively.

Moreover, when the first and second impurity regions and the third and fourth impurity regions are formed, diffusion takes place at the first impurity region 39 and the fourth impurity region 42 in the direction perpendicular to the surface of the semiconductor substrate 31. At the second impurity region 40 and the third impurity region 43 formed at the bottom of the second trench 35, diffusion takes place to the direction parallel to the semiconductor substrate 31. Thus, lengths of the channels are readily controllable.

Figure 5D:
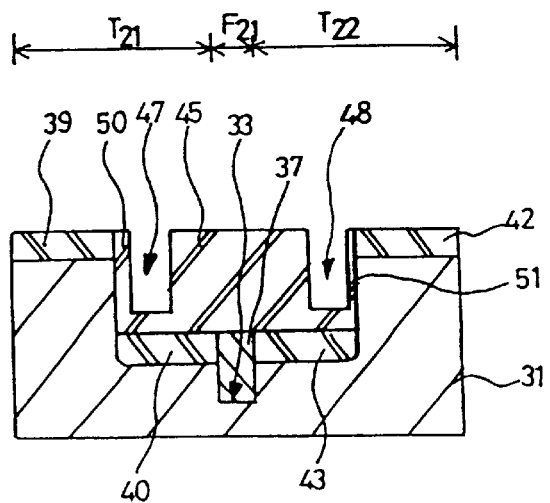

In FIG. 5D, a second field oxide layer 45 of silicon oxide is formed in the second trench 35. In this process, the second field oxide layer 45 is formed on the semiconductor substrate 31 by depositing the silicon oxide to fill up the second trench 35 with CVD. The silicon oxide is then etched back to remove a portion of the silicon oxide outside the second trench 35 using RIE or CMP.

Third and fourth trenches 47 and 48 having a width between 1000 and 2000 Å and a depth between 1000 and 6000 Å are formed in the first and second transistor regions T21 and T22 by etching the second field oxide layer 45 by an anisotropic etching method such as RIE. In this process, the second field oxide layer 45 remaining between the sides of the second trench 35 and the third and fourth trenches 47 and 48 becomes first and second gate oxide layers 50 and 51. Thus, thicknesses of the first and second gate oxide layers 50 and 51 are precisely controlled as the third and fourth trenches 47 and 48 are formed. The thicknesses of the first and second gate oxide layers 50 and 51 are preferably between 40 and 70 Å and between 100 and 150 Å, respectively.

Figure 5E:
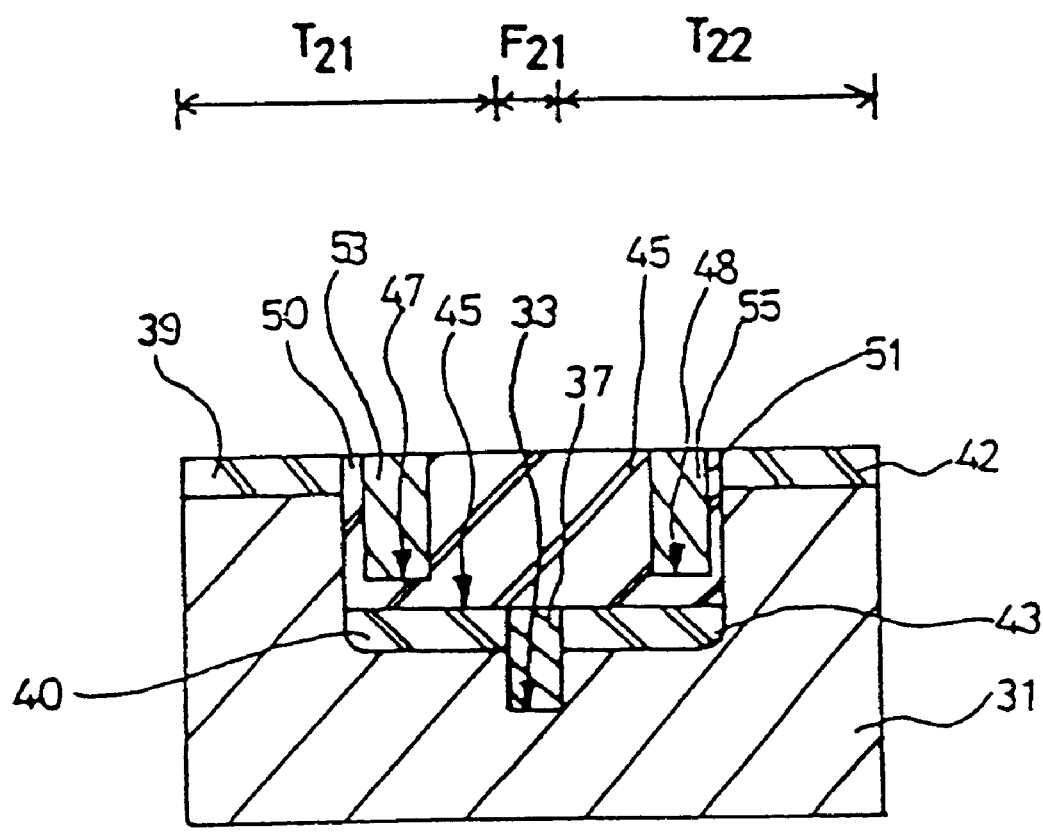

Referring to FIG. 5E, first and second gates 53 and 55 are formed in the third trenches 47 and 48. The first and second gates 53 and 55 are formed by depositing polycrystalline silicon doped with impurities with CVD on the semiconductor substrate 31 and the second field oxide layer 45. The polycrystalline silicon fills up the third trenches 47 and 48 and is etched back with CMP or RIE to expose the second field oxide layer 45. In this case, a planarization is readily achieved since the first and second gates 53 and 55 are buried in the third and fourth trenches 47 and 48.

As explained in the above description, the semiconductor device according to the present invention is formed by forming a second field oxide layer in a second trench which has been formed in a portion including predetermined portions of first and second transistor regions and a field area, by forming first and second gate oxide layers having different thicknesses from each other by leaving portions of the second field oxide layer between second and third trenches and second and fourth trenches in the first and second transistor regions of the second field oxide layer, and by forming first and second gates buried in the third and fourth trenches.

Accordingly, in the present invention, thicknesses of gate oxide layers are easily controllable and degree of integration is improved since channel regions are vertically formed and impurity regions at the bottom of a second trench are overlapped with a second field oxide layer. The invention also provides an improved planarization for multi-layered wires as first and second gates are buried in third trenches.

Moreover, a short channel effect is suppressed by controlling channel lengths because diffusion takes place at the second and third impurity regions at the bottom of the second trench in the horizontal direction and at the first and fourth impurity regions on the semiconductor substrate in the vertical direction.

It will be apparent to those skilled in the art that various modifications and variations can be made in a semiconductor device and a method of fabricating the same of the present invention without departing from the spirit or scope of the inventions. Thus, it is intended that the present invention cover the modifications and variations of this invention provided they come within the scope of the appended claims and equivalents.

What is claimed is:

1. A method of fabricating a semiconductor device having first and second transistor regions and a field region, the method comprising the steps of:

forming a first trench in the field area of a semiconductor substrate, thereby defining the first and second transistor regions;

forming a second trench over the first trench in the semiconductor substrate;

forming a first field oxide layer in the first trench;

forming first, second, third and fourth impurity regions outside the second trench and on the bottom surface of the second trench except where the first field oxide layer is formed;

forming a second field oxide layer in the second trench over the second and third impurity regions including the first field oxide layer;

forming third and fourth trenches in the second field oxide layer, so as to define first and second gate oxide layers; and forming first and second gates in the third and fourth trenches.

2. The method according to claim 1, wherein the steps of forming first and second trenches include anisotropic etching.

3. The method according to claim 1, wherein the first trench is formed to have a depth in the range of 1000 and 2000 Å.

4. The method of fabricating semiconductor device according to claim 1, wherein the second trench is formed to have a depth in the range of 1500 and 8000 Å.

5. The method according to claim 1, wherein the step of forming a first field oxide layer includes the steps of:

forming a silicon oxide layer on the semiconductor substrate to fill up the first trench; and etching back the silicon oxide layer to remove the silicon oxide layer outside the first trench.

6. The method of fabricating semiconductor device according to claim 3, wherein the step of forming a second field oxide layer includes the steps of:

forming a silicon oxide layer on the semiconductor substrate to fill up the second trench; and etching back the silicon oxide layer to remove the silicon oxide layer formed outside the second trench by at least one of chemical-mechanical polishing and reactive ion etching.

7. The method according to claim 1, wherein the first and second gate oxide layers are formed to have thicknesses in the range of 40 and 70 Å and 100 and 150 Å, respectively.

8. The method according to claim 1, wherein the step of forming first and second gates include the steps of:

forming an impurity doped-polycrystalline silicon layer on the semiconductor substrate to fill up the third and fourth trenches; and etching back the polycrystalline silicon layer to remove the polycrystalline silicon layer formed outside the third and fourth trenches by at least one of chemical-mechanical polishing and reactive ion etching.

* * * * *